(12) United States Patent
Kim (10) Patent No.: US 10,256,804 B2
(45) Date of Patent: Apr. 9, 2019

(54) FAULT DETECTOR FOR ANTI-PARALLEL THYRISTOR

(71) Applicant: LSIS CO., LTD., Anyang-si, Gyeonggi-do (KR)

(72) Inventor: Young Woo Kim, Anyang-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 237 days.

(21) Appl. No.: 15/343,035

(22) Filed: Nov. 3, 2016

(65) Prior Publication Data

US 2017/0244404 A1    Aug. 24, 2017

(30) Foreign Application Priority Data

Feb. 19, 2016    (KR) .......................... 10-2016-0019962

(51) Int. Cl.
| | | |
|---|---|---|
| G01R 31/26 | (2014.01) | |
| G01R 19/165 | (2006.01) | |
| G01R 31/265 | (2006.01) | |
| G01R 31/333 | (2006.01) | |
| H03K 17/0814 | (2006.01) | |

(52) U.S. Cl.
CPC . H03K 17/08144 (2013.01); G01R 19/16571 (2013.01); G01R 31/263 (2013.01); G01R 31/3333 (2013.01); *G01R 31/265* (2013.01)

(58) Field of Classification Search
CPC ............................ G01R 31/263; G01R 31/265; G01R 31/3333; G01R 19/16571; H03K 17/08144
USPC ............................................................ 361/87
See application file for complete search history.

(56) References Cited

U.S. PATENT DOCUMENTS

| | | | | |
|---|---|---|---|---|
| 5,877,691 A | * | 3/1999 | Suptitz | ............... H01H 71/0228 340/638 |
| 6,211,792 B1 | | 4/2001 | Jadric et al. | |
| 2014/0002117 A1 | | 1/2014 | Woodley | |

FOREIGN PATENT DOCUMENTS

| | | |
|---|---|---|
| CN | 102253331 A | 11/2011 |
| CN | 102279335 A | 12/2011 |
| CN | 203433084 U | 2/2014 |
| EP | 1203434 | 5/2002 |
| JP | S54166530 | 11/1979 |
| JP | S59142771 | 9/1984 |
| JP | S59220018 | 12/1984 |
| JP | S63004183 | 1/1988 |
| JP | 05-260645 | 8/1993 |
| JP | 1995-46067 | 10/1995 |

(Continued)

OTHER PUBLICATIONS

European Patent Office Application Serial No. 16191090.6, Search Report dated Jul. 18, 2017, 9 pages.

(Continued)

*Primary Examiner* — Kevin J Comber
(74) *Attorney, Agent, or Firm* — K&L Gates LLP (57) ABSTRACT

A fault detector for an anti-parallel thyristor includes: a power supply unit configured to supply power to the first and second thyristors; a first current sensor configured to output a first current measurement value that flows through the first thyristor; a second current sensor configured to output a second current measurement value that flows through the second thyristor; and a detector which notifies a fault of a thyristor when the first and second current measurement values satisfy a set fault condition.

11 Claims, 9 Drawing Sheets

(56) References Cited

FOREIGN PATENT DOCUMENTS

| JP | H10337029 | 12/1998 |
| JP | 2003507993 | 2/2008 |
| JP | 2016025424 | 2/2016 |
| KR | 100882727 | 2/2009 |
| KR | 20150118730 | 10/2015 |

OTHER PUBLICATIONS

Japan Patent Office Application No. 2016-210480, Office Action dated Sep. 5, 2017, 2 pages.
Chinese Office Action dated Jan. 28, 2019 in related Chinese Application No. 201610954344.5; (6 Pages).

* cited by examiner

FAULT DETECTOR FOR ANTI-PARALLEL THYRISTOR

CROSS-REFERENCE TO RELATED APPLICATIONS

Pursuant to 35 U.S.C. § 119(a), this application claims benefit of earlier filing date and right of priority to Korean Patent Application No. 10-2016-0019962, filed on Feb. 19, 2016, the contents of which are all hereby incorporated by reference herein in its entirety.

BACKGROUND

The present invention relates to a fault detector for an anti-parallel thyristor.

Specifically, the present invention relates to a fault detector for detecting a fault of a thyristor level connected to a static var compensator (SVC). A thyristor valve used in the SVC may be connected in anti-parallel. Additionally, the SVC may be applied to a high voltage direct current (HVDC) system.

The HVDC is a method of power transmission. The HVDC system converts high voltage AC power generated by a power generator into high-efficiency high voltage DC power by using a power converter and transmits the DC power. Thereafter, the DC power is converted into the AC power in a desired area by using a power converter. As compared with high voltage alternating current (HVAC), the HVDC system may be advantageous to long-distance power transmission due to low power loss.

A valve type of the power converter used in the HVDC system may be classified into a current source scheme based on a thyristor and a voltage source scheme based on an insulated gate bipolar mode transistor (IGBT). The current source scheme started to be employed in an HVDC system in the early 1980s and is widely used for commercial purposes till now. On the other hand, the voltage source scheme started to be commercially employed in an HVDC system in the early 2000s and the capacity thereof tends to increase. However, the capacity of the voltage source scheme is small as compared with the current source scheme, and thus, the voltage source scheme is mostly used to connect a large-scale offshore wind farm to an AC power network.

Among a plurality of components included in the HVDC system, the most important component is a power converter which converts DC into AC and converts AC into DC. Since the power converter has a very high operating voltage, a plurality of thyristors are connected in series to constitute one valve. Before the power converter is installed, it is necessary to check the operations of these valves with a voltage and power to be applied during operations. However, the checking of the operations with the voltage and power to be applied during operations consumes considerable power and may cause safety problems.

Meanwhile, the SVC implements a reactive power control function of a synchronous condenser, which is a rotor, in a static type by using a thyristor valve. The SVC is a type of a flexible AC transmission system (FACTS) and may be an apparatus which enables voltage adjustment of a transmission system, transient stability improvement, and the like.

The SVC may be an apparatus which is connected in parallel to a power system and constantly maintains a voltage or performs a desired control operation through absorption or supply of reactive power.

The SVC may be implemented by combining a thyristor controlled reactor (TCR) which controls a phase of a reactor by using a thyristor, a thyristor switched capacitor (TSC) which switches a capacitor, and a fixed capacitor bank, according to intended use.

Thyristor valves used in the TCR and the TSC may be connected in anti-parallel.

The thyristors may become defective due to unintended overvoltage, impulse overcurrent, or the like. Generally, a resistance of a defective thyristor may be 0 Ω, and a defective thyristor may be easily detected through a multimeter.

However, when one of anti-parallel thyristors is referred to as a first thyristor, the other is referred to as a second thyristor, and internal resistances of the first and second thyristors are respectively R1 and R2, a combined resistance (R) is R1*R2/(R1+R2). Thus, if one of R1 and R2 is 0 Ω, the combined resistance (R) is 0 Ω. From this, the defective thyristor can be determined from the first and second thyristors.

That is, due to the structure of the anti-parallel thyristors, in order to determine the fault of the defective thyristor, there may be an inconvenience of having to separate the anti-parallel thyristors and determine the respective thyristors by using a multimeter.

SUMMARY

Embodiments provide a fault detector for an anti-parallel thyristor, which is capable of easily determining a fault of a thyristor, thereby improving user convenience and reducing a maintenance time.

In one embodiment, a fault detector for an anti-parallel thyristor, which detects fault of first and second thyristors connected in anti-parallel to each other, includes: a power supply unit configured to supply power to the first and second thyristors; a first current sensor configured to output a first current measurement value that flows through the first thyristor; a second current sensor configured to output a second current measurement value that flows through the second thyristor; and a detector which notifies a fault of a thyristor when the first and second current measurement values satisfy a set fault condition, wherein the fault condition is that a measurement range of a current when at least one of the first thyristor and the second thyristor is defective exceeds a measurement range of a current when the first thyristor and the second thyristor normally operate.

The detector may include: a comparator connected to the first and second current sensors; a detection logic connected to the comparator; and first and second output units connected to the detection logic.

The comparator may set a normal range for determination as normal and a fault range for determination as defective.

The fault range may be greater than the normal range.

The comparator may compare the first or second current measurement value with the normal range, and may not output any signal when the first or second current measurement value is in the normal range.

The comparator may compare the first or second current measurement value with the fault range, and output a discrete signal when the first or second current measurement value is in the fault range.

The discrete signal may include first and second signals having different levels with respect to the first and second thyristors.

The detection logic may generate a fault signal based on the first signal and transmit the fault signal to the first output unit.

The detection logic may generate a fault signal based on the second signal and transmit the fault signal to the second output unit.

The first output unit or the second output unit may output a fault notification signal corresponding to the fault signal.

Each of the first and second current sensors may be a Rogowski coil current sensor.

The first current sensor may measure a current flowing through the first thyristor in a state of being in non-contact with the first thyristor, and the second current sensor may measure a current flowing through the second thyristor in a state of being in non-contact with the second thyristor.

The power supply unit may receive power from the outside and supplies the power to the inside of the detector and the first and second thyristors.

The first and second thyristors connected in anti-parallel to each other may further include an RC snubber circuit, and the RC snubber circuit may include a resistor and a capacitor connected in series to each other.

The details of one or more embodiments are set forth in the accompanying drawings and the description below. Other features will be apparent from the description and drawings, and from the claims.

DETAILED DESCRIPTION OF THE EMBODIMENTS

Hereinafter, embodiments of the present disclosure will be described in detail with reference to the accompanying drawings.

Figure 1:
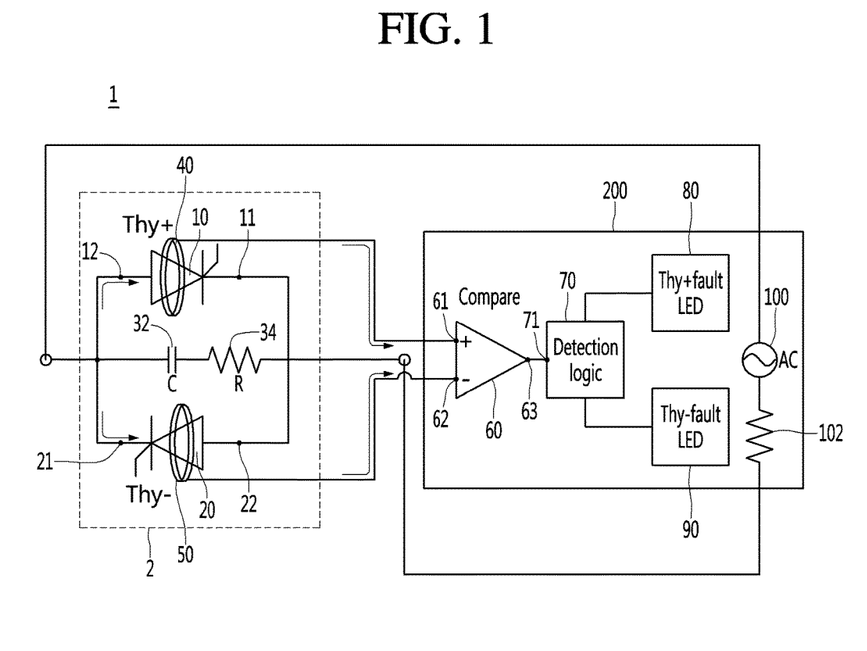
FIG. 1 is a view illustrating a fault detector for an anti-parallel thyristor according to an embodiment of the present invention.

FIG. 1 is a view illustrating a fault detector for an anti-parallel thyristor according to an embodiment of the present invention.

Referring to FIG. 1, a fault detector 1 for an anti-parallel thyristor according to an embodiment of the present invention may include a valve 2, a detector 200, and a power supply unit 100.

The power supply unit 100 may be included in the detector 200, but is not limited thereto. The power supply unit 100 may supply power to the inside of the detector (200) and first and second thyristors 10 and 20.

The valve 2 may include the first and second thyristors 10 and 20 connected in anti-parallel to each other.

A first current sensor 40 may be installed on one side of the first thyristor 10 to measure a first measurement value with respect to a current supplied to the first thyristor 10.

A second current sensor 50 may be installed on one side of the second thyristor 20 to measure a second measurement value with respect to a current supplied to the second thyristor 20.

The first and second current sensors 40 and 50 may be included in the detector 200, but are not limited thereto.

Each of the first current sensor 40 and the second current sensor 50 may be a Rogowski coil current sensor. The Rogowski coil current sensor may be similar to a current transformer (CT), but the Rogowski coil current sensor has no metal core, can easily measure high current, and is inexpensive. Additionally, the Rogowski coil current sensor may output a voltage signal.

A Rogowski coil may be a coil for measuring a current by using a change in magnetic flux generated by a current conversion, and a wire may be wound around the Rogowski coil in a torus shape.

The detector 200 may compare the first and second measurement values respectively received from the first and second current sensors 40 and 50 and check whether the comparison result of the first and second measurement values satisfies a set fault condition. Additionally, when the comparison result satisfies the fault condition, the detector 200 may output a fault notification signal with respect to at least one of the first and second thyristors 10 and 20.

The fault condition is that a second range exceeds a first range. The first range is a measurement range of a current when the first thyristor 10 and the second thyristor 20 normally operate, and the second range is a measurement range of a current when at least one of the first thyristor 10 and the second thyristor 20 is defective.

The detector 200 may include a comparator 60 connected to the first and second current sensors 40 and 50, a detection logic 70 connected to the comparator 60, and a first output unit 80 and a second output unit 90 connected to the detection logic 70.

The comparator 60 may compare the first and second measurement values respectively received from the first and second current sensors 40 and 50 and output a discrete signal indicating states of the first or second thyristors 10 and 20 based on the comparison.

The discrete signal may be a first signal or a second signal. For example, the first signal may be outputted when the first thyristor 10 is defective, and the second signal may be outputted when the second thyristor 20 is defective. For example, the first signal may have a high level when the first thyristor 10 is defective and the second signal may have a low level when the second thyristor 10 is defective, but the present invention is not limited thereto.

The detection logic 70 may receive the first signal or the second signal, determine a defective thyristor from the first and second thyristors 10 and 20, and generate a fault signal with respect to the defective thyristor when the defective thyristor is defective.

The first output unit 80 or the second output unit 90 may output the fault signal.

When the detection logic 70 receives the first signal, the detection logic 70 may generate the fault signal indicating the fault of the first thyristor 10 in response to the first signal, and transmit the fault signal to the first output unit 80. When the detection logic 70 receives the second signal, the detection logic 70 may generate the fault signal indicating the fault of the second thyristor 20 in response to the second signal, and transmit the fault signal to the second output unit 90. The first output unit 80 or the second output unit 90, which receives the fault signal, may output the fault notification signal.

Each of the first and second output units 80 and 90 may be a light-emitting diode (LED), but is not limited thereto.

As another example, instead of the first and second output units 80 and 90, a display unit may be used to display the fault of the first thyristor 10 or the second thyristor 20, but the present invention is not limited thereto.

A first input terminal 61 of the comparator 60 may be connected to one of the first and second current sensors 40 and 50, and a second input terminal 62 of the comparator 60 may be connected to the other of the first and second current sensors 40 and 50.

The power supply unit 100 may receive power from the outside and supply the power to the inside of the detector 200 and the first and second thyristors 10 and 20.

The first and second thyristors 10 and 20 connected in anti-parallel to each other may further include an RC snubber circuit 32 and 34. The RC snubber circuit 32 and 34 may include a resistor 34 and a capacitor 32 connected in series to each other. The RC snubber circuit 32 and 34 is also called an RC low-pass filter.

The power supply unit 100 may be connected to a load 102. The power supply unit 100 and the load 102 may be connected in series to each other.

The load 102 may be a device which consumes output energy of an electrical or mechanical energy generator, or may be the magnitude of power consumption.

Figure 2:
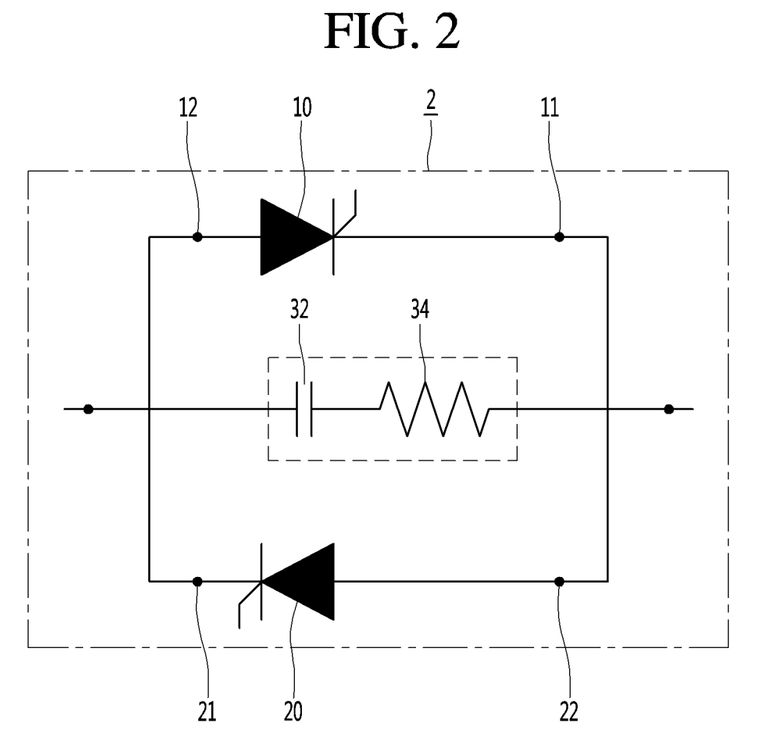
FIG. 2 is a view illustrating a detailed configuration of a valve of FIG. 1.

FIG. 2 is a view illustrating the detailed configuration of the valve of FIG. 1.

Referring to FIG. 2, the valve 2 may include the anti-parallel thyristors 10 and 20 and the RC snubber circuit 32 and 34.

Specifically, the anti-parallel thyristors 10 and 20 may include the first thyristor 10 and the second thyristor 20 connected in anti-parallel to each other.

The RC snubber circuit 32 and 34 may be connected in parallel between the first thyristor 10 and the second thyristor 20 connected in anti-parallel to each other.

The capacitor 32 and the resistor 34 included in the RC snubber circuit 32 and 34 may be connected in series to each other.

The RC snubber circuit 32 and 34 may be connected in parallel to the anti-parallel thyristors 10 and 20.

Specifically, a cathode terminal 11 of the first thyristor 10 may be connected to an anode terminal 22 of the second thyristor 20, and a cathode terminal 21 of the second thyristor 20 may be connected to an anode terminal 12 of the first thyristor 10.

Additionally, one terminal of the RC snubber circuit 32 and 34 may be connected to a first node at which the cathode terminal 11 of the first thyristor 10 is connected to the anode terminal 22 of the second thyristor 20, and the other terminal of the RC snubber circuit 32 and 34 may be connected to a second node at which the cathode terminal 21 of the second thyristor 20 is connected to the anode terminal 12 of the first thyristor 10.

The RC snubber circuit 32 and 34 may reduce switching loss when an input ripple voltage is boosted to a certain output voltage.

Figure 3:
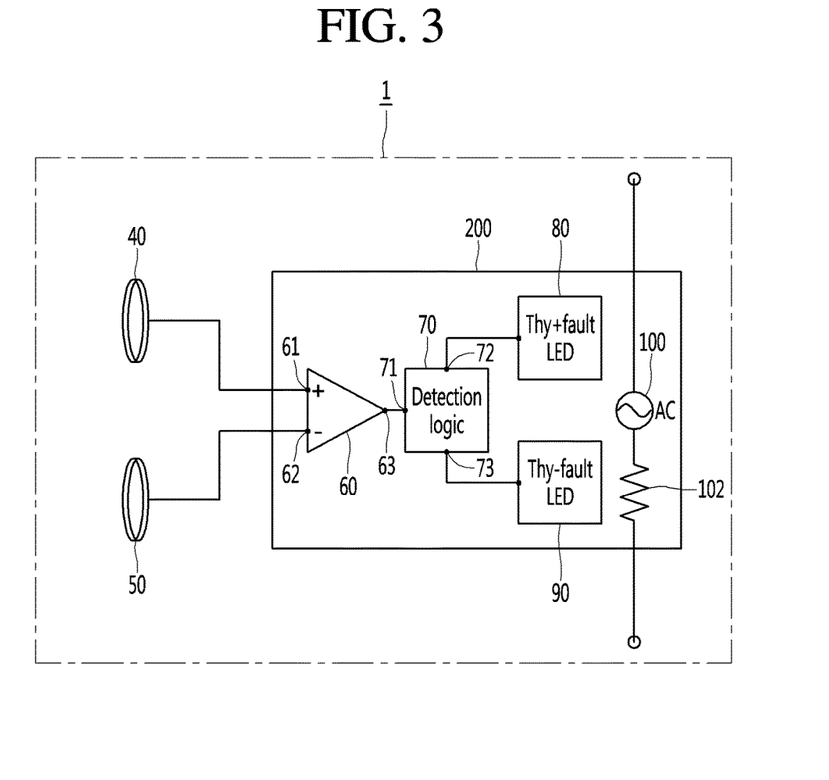
FIG. 3 is a view illustrating a detailed configuration of a detector of FIG. 1.

FIG. 3 is a view illustrating the detailed configuration of the detector of FIG. 1.

Referring to FIG. 3, the detector 200 may include the comparator 60, the detection logic 70, and the first and second output units 80 and 90.

Although not illustrated, the first and second current sensors 40 and 50 may also be included in the detector 200, but the present invention is not limited thereto.

The detector 200 may be operated by the power supplied from the power supply unit 100 and detect the fault of the first and second thyristors 10 and 20.

The comparator 60 may be connected to the first and second current sensors 40 and 50 and the detection logic 70, and the detection logic 70 may be connected to the first and second output units 80 and 90.

Specifically, the first current sensor 40 and the second current sensor 50 may be respectively connected to the first input terminal 61 and the second input terminal 62 of the comparator 60.

The first current sensor 40 and the second current sensor 50 may be respectively connected to the first thyristor 10 and the second thyristor 20 to measure a current flowing through the first thyristor 10 and a current flowing through the second thyristor 20.

The first and second current sensors 40 and 50 may be the Rogowski coil current sensors. For example, in one of the Rogowski coil current sensors, a coil may be wound around a forward thyristor of the anti-parallel thyristors, e.g., the first thyristor 10. In the other of the Rogowski coil current sensors, a coil may be wound around a reverse thyristor of the anti-parallel thyristors, e.g., the second thyristor 20.

That the coil is wound may mean that the first and second current sensors 40 and 50 measure the currents in a non-contact state, that is, in a state of not directly contacting the anti-parallel thyristors 10 and 20.

Even when the anti-parallel thyristors, that is, the first and second thyristors 10 and 20 are not separated, the first and second current sensors 40 and 50 may be wound around the anti-parallel thyristors 10 and 20 in a non-contact state and measure the currents. In this way, it is possible to detect the fault of each of the anti-parallel thyristors 10 and 20 without separating the anti-parallel thyristors 10 and 20, thereby improving user convenience.

The comparator 60 may receive the first and second measurement values from the first and second current sensors 40 and 50 and output a discrete signal having logic 1 (high) or logic 0 (low) based on the first and second measurement values. For example, logic 1 may be the first signal and logic 0 may be the second signal, but the present invention is not limited thereto.

The detection logic 70 may determine a defective thyristor from the first and second thyristors 10 and 20 connected in anti-parallel to each other, based on the discrete signal received from the comparator 60.

The detection logic 70 may be a simple logic circuit or various types of processors. Additionally, when the discrete signal of the comparator 60 is logic 1 (high), the detection logic 70 may determine the first thyristor 10 as defective, and when the discrete signal is logic 0 (low), the detection logic 70 may determine the second thyristor 20 as defective.

Unlike this, when the discrete signal is logic 1 (high), the detection logic 70 may determine the second thyristor 20 as defective, and when the discrete signal is logic 0 (low), the detection logic 70 may determine the first thyristor 10 as defective.

The first and second output units 80 and 90 may output the fault notification signal.

The first and second output units 80 and 90 may be speakers, CCFL (Cold Cathode Fluorescent Lamp), EEFL (External Electrode Fluorescent Lamp) lamps, light bulb, LED (Light-Emitting Diode), or monitors. Specifically, the first and second output units 80 and 90 may be LED lamps which output light signals.

The comparator 60 may include a first input terminal 61, a second input terminal 62, and a discrete signal output terminal 63.

The first input terminal 61 of the comparator 60 may be connected to one of the first and second current sensors 40 and 50, preferably the first current sensor 40, and the second input terminal 62 of the comparator 60 may be connected to the other of the first and second current sensors 40 and 50, preferably the second current sensor 50. In the following description, it is assumed that the first current sensor 40 is connected to the first input terminal 61 of the comparator 60 and the second current sensor 50 is connected to the second input terminal 62 of the comparator 60, but the present invention is not limited thereto.

The comparator 60 may compare the magnitudes of current values respectively included in the first and second measurement values. Specifically, the magnitude of the current value included in the first or second measurement value may be compared with a first range or a second range.

The first range may be a normal range for determination as normal, and the second range may be a fault range for determination as defective. The second range may be greater than the first range.

Through such a comparison, the discrete signal having logic 1 (high) or logic 0 (low) may be outputted as the output value of the comparator 60. The discrete signal having logic 1 (high) may be a fault signal of the first thyristor 10, and the discrete signal having logic 0 (low) may be a fault signal of the second thyristor 20.

Specifically, when the first measurement value of the current of the first thyristor 10 measured by the first current sensor 40 is in the fault range greater than the normal range for determination as normal, the comparator 60 may output the discrete signal having logic 1 (high), and when the first measurement value is in the normal range, the comparator 60 may not output any discrete signal.

Additionally, when the second measurement value of the current of the second thyristor 20 measured by the second current sensor 50 is in the fault range greater than the normal range for determination as normal, the comparator 60 may output the discrete signal having logic 0 (low), and when the second measurement value is in the normal range, the comparator 60 may not output any discrete signal.

In contrast, when the first measurement value of the current of the first thyristor 10 measured by the first current sensor 40 is in the fault range greater than the normal range for determination as normal, the comparator 60 may output the discrete signal having logic 0 (low), and when the first measurement value is in the normal range, the comparator 60 may not output any discrete signal.

Additionally, when the second measurement value of the current of the second thyristor 20 measured by the second current sensor 50 is in the fault range greater than the normal range for determination as normal, the comparator 60 may output the discrete signal having logic 1 (high), and when the second measurement value is in the normal range, the comparator 60 may not output any discrete signal.

The detection logic 70 may be connected to the discrete signal output terminal 63 of the comparator 60.

The detection logic 70 may determine which one of the first and second thyristors 10 and 20 constituting the anti-parallel thyristors is defective, based on the discrete signal received from the comparator 60. The detection logic 70 may generate a fault signal based on the determination result and output the fault signal to the first output unit 80 and/or the second output unit 90.

The detection logic 70 may include a discrete signal input terminal 71 through which the discrete signal is inputted, and first and second fault signal output terminals 72 and 73 through which the fault signal is outputted.

The discrete signal input terminal 71 of the detection logic 70 may be connected to the discrete signal output terminal 63 of the comparator 60.

The output units 80 and 90 may include a first output unit 80 and a second output unit 90. The first and second output units 80 and 90 may be speakers, lamps, electric lamps, or monitors. Specifically, the first and second output units 80 and 90 may be LED lamps which output light signals.

The first output unit 80 may be connected to the first fault signal output terminal 72 of the detection logic 70, and the second output unit 90 may be connected to the second fault signal output terminal 73 of the detection logic 70. Unlike this, the first output unit 80 may be connected to the second fault signal output terminal 73 of the detection logic 70, and the second output unit 90 may be connected to the first fault signal output terminal 72 of the detection logic 70.

For convenience of the following description, it may be assumed that the first output unit 80 is connected to the first fault signal output terminal 72 of the detection logic 70, and the second output unit 90 is connected to the second fault signal output terminal 73 of the detection logic 70.

Each of the first output unit 80 and the second output unit 90 may output a light signal, a sound signal, or the like as the fault signal.

Figure 4:
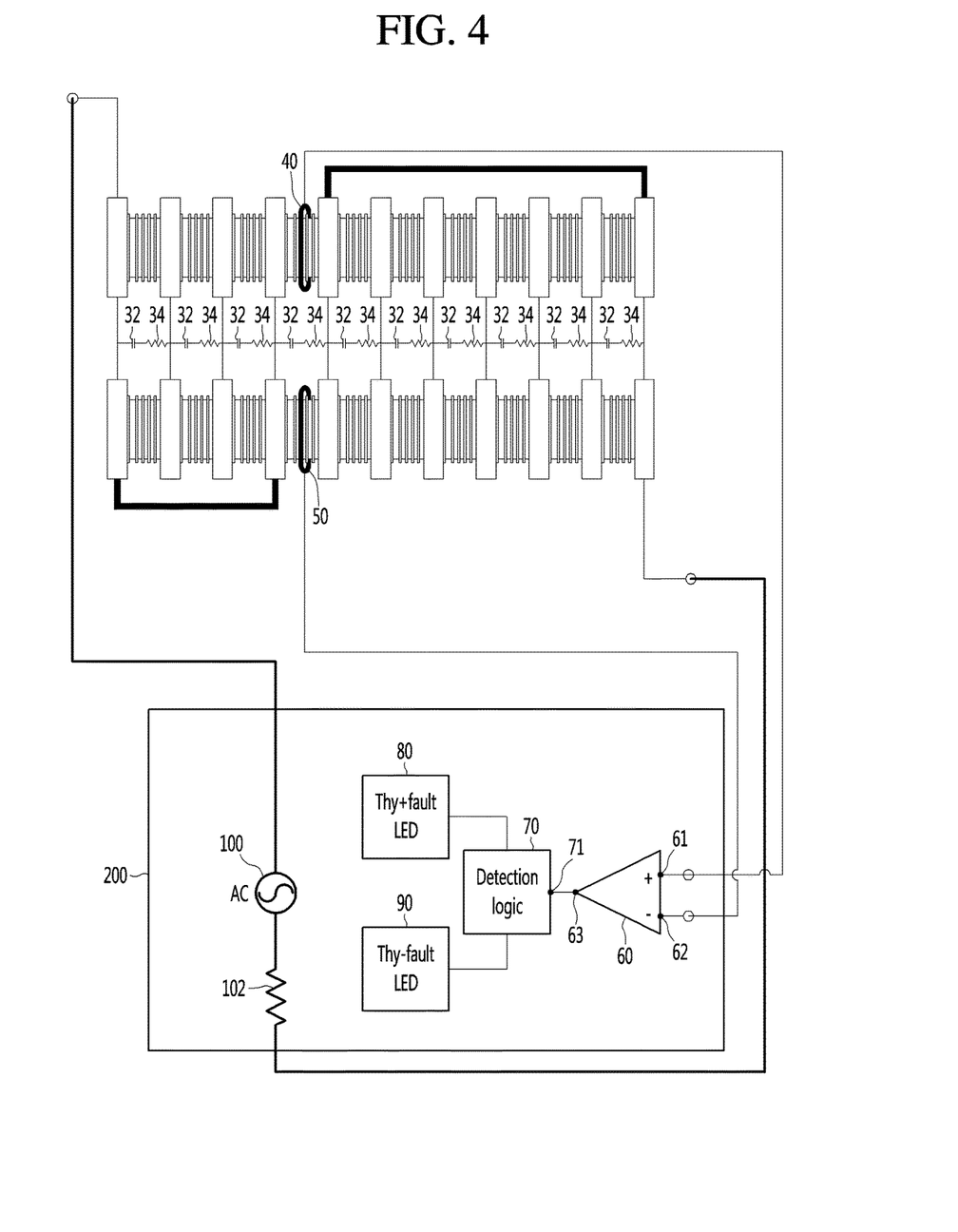
FIG. 4 is a view illustrating a connection of a fault detector for an anti-parallel thyristor to a defective valve among thyristor valves according to an embodiment of the present invention.

FIG. 4 is a view illustrating the connection of the fault detector 1 for the anti-parallel thyristor to a valve including a defective one of the thyristor valves according to an embodiment of the present invention.

Referring to FIGS. 1 to 4, the first current sensor 40 may measure the current of the first thyristor 10 in a state of being in non-contact with the first thyristor 10, and the second current sensor 50 may measure the current of the second thyristor 20 in a state of being in non-contact with the second thyristor 20.

The connection of the first thyristor 10 and the first current sensor 40 and the connection of the second thyristor 20 and the second current sensor 50 may be the winding of the coils of the Rogowski coil current sensors around the thyristors in a non-contact state.

The power supply unit 100 included in the detector 200 may be connected to the RC snubber circuit 32 and 34, and the RC snubber circuit 32 and 34 may be connected in parallel to the anti-parallel thyristors 10 and 20.

Specifically, one terminal of the power supply unit 100 may be connected to one terminal of the capacitor 32 of the RC snubber circuit 32 and 34, and the other terminal of the capacitor 32 may be connected to one terminal of the resistor 34 of the RC snubber circuit 32 and 34. The other terminal of the resistor 34 may be connected to the other terminal of the power supply unit 100.

When at least one of the first and second thyristors and 20 included in the thyristor valve 2 is defective, the power supply unit 100 of the detector 200 may supply power to the thyristor valve 2 and the first and second current sensors 40 and 50 of the detector 200 may be connected to the thyristor valve 2, so that both the current of the defective thyristor and the current of the normal thyristor are measured.

Since the internal resistance of the defective thyristor is close to 0 Ω, a larger current may flow through the defective thyristor, as compared with the normal thyristor. The first and second current sensors 40 and 50 transmit a current measurement value measured from the defective thyristor or a current measurement value measured from the normal thyristor to the comparator 60. By using the fact that the internal resistance of the defective thyristor is close to 0 Ω, the comparator 60 may compare whether a larger current flows as compared with the normal thyristor and output a discrete signal. At this time, the first range for determination as normal and the second range for determination as defective may be set. The second range may be greater than the first range.

For example, in the first and second thyristors 10 and 20 constituting the anti-parallel thyristor, the first thyristor may have a first internal resistance R1 and the second thyristor 20 may have a second internal resistance R2.

When a voltage (V) applied to the first and second thyristors 10 and 20 is 100 V, the first thyristor 10 is normal, and R1 is 10 Ω, a current (I1) of 10 A may be outputted.

However, when the voltage (V) applied to the first and second thyristors 10 and 20 is 100 V, the second thyristor 20 is defective, and R2 is close to 0 Ω, a current (I2) may be greater than 10 A.

Since the valve 2 includes the first thyristor 10 and the second thyristor 20 connected in parallel to each other, a resistance of the valve 2 may be a combined resistance of the first thyristor 10 and the second thyristor 20. The combined resistance may be denoted with R.

Since the combined resistance R is R1*R2/(R1+R2), if one of R1 and R2 is 0 Ω, the combined resistance R is 0 Ω. Thus, the defective thyristor cannot be known. If the current of each of the first and second current sensors 40 and 50 is measured, a current value measured from the defective thyristor is greater than a current value measured from the normal thyristor. Thus, the defective thyristor can be more easily determined.

Additionally, the comparator 60 may receive the first and second measurement values respectively measured from the first and second thyristors 10 and 20 and output the discrete signal having logic 1 (high) or logic 0 (low) when the thyristor is defective. The detection logic 70 may receive the discrete signal and determine the defective thyristor based on the discrete signal. When the thyristor is not defective, the comparator 60 may not output any discrete signal, but the present invention is not limited thereto.

The detection logic 70 may be connected to the first and second output units 80 and 90. For example, the fault or non-fault of the first thyristor 10 may be notified through the first output unit 80, and the fault or non-fault of the second thyristor 20 may be notified through the second output unit 90. That is, since the fault notification signal is outputted through the output unit set to correspond to the defective thyristor, the defective thyristor can be more easily confirmed and identified.

Figure 5A:
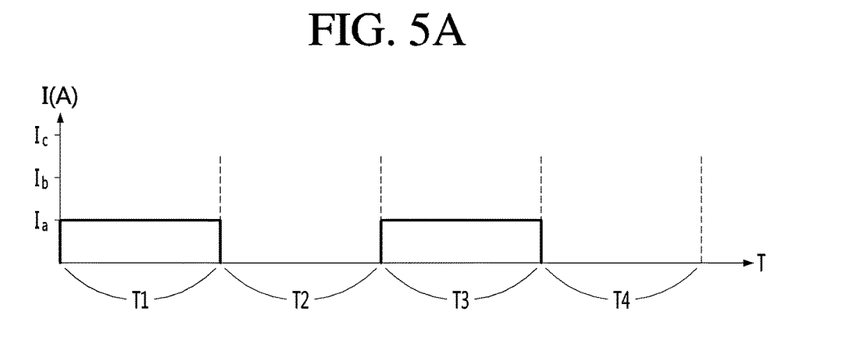
FIGS. 5A, 5B, 5C are views illustrating a state of a current of a normal thyristor according to a period in the fault detector for the anti-parallel thyristor according to an embodiment of the present invention.
Figure 5B:
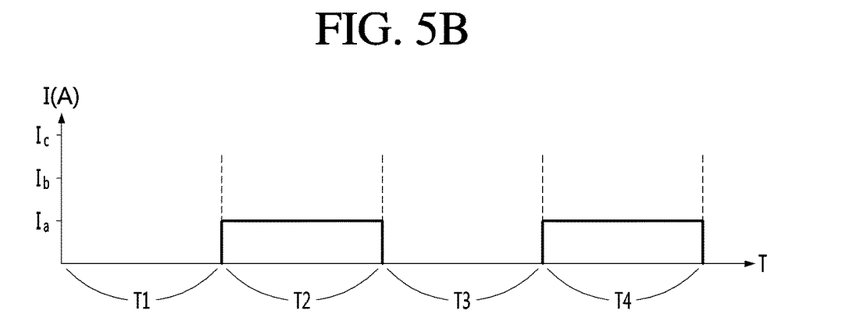
Figure 5C:
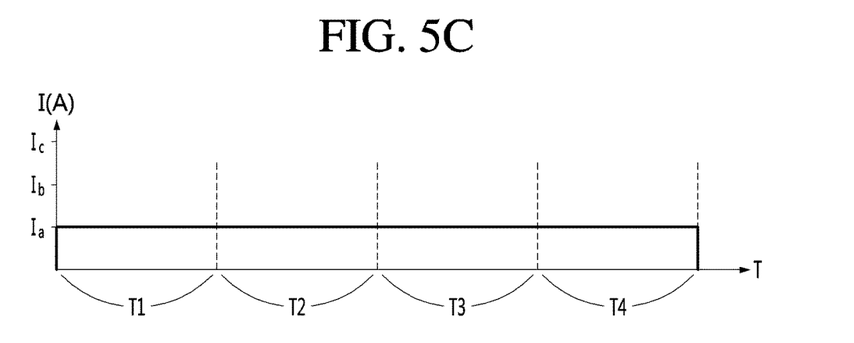
Figure 6A:
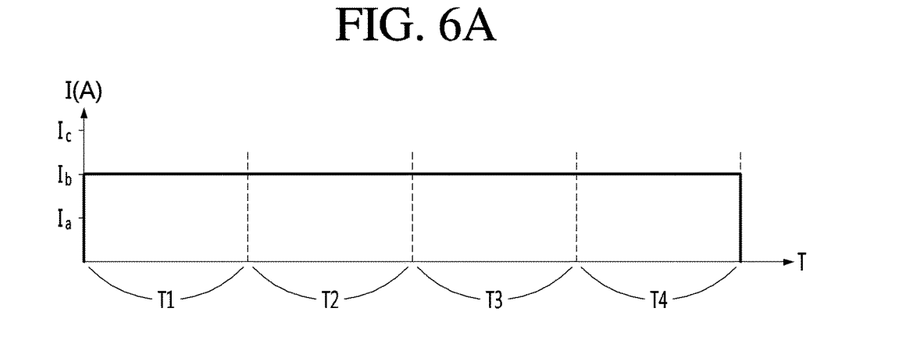
FIGS. 6A, 6B, 6C, are views illustrating a state of a current of a defective thyristor according to a period in the fault detector for the anti-parallel thyristor according to an embodiment of the present invention.
Figure 6B:
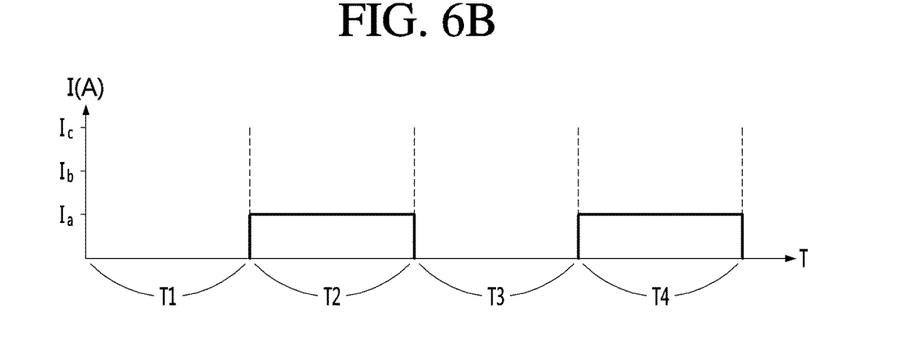
Figure 6C:
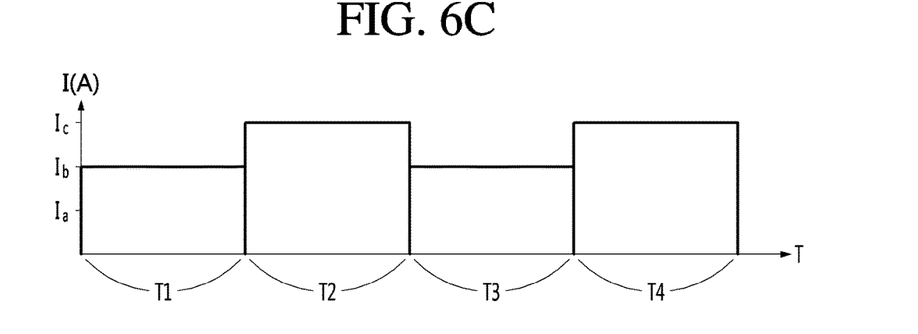

FIG. 5 is a view illustrating a state of a current of a normal thyristor according to a period in the fault detector for the anti-parallel thyristor according to an embodiment of the present invention, and FIG. 6 is a view illustrating a state of a current of a defective thyristor according to a period in the fault detector for the anti-parallel thyristor according to an embodiment of the present invention.

FIG. 5 may be first and second measurement values with respect to currents I flowing through the thyristors according to a period T during the normal operations of the first and second thyristors 10 and 20, and FIG. 6 may illustrate first and second measurement values with respect to a current I according to a period T when one of the first and second thyristors 10 and 20 is defective.

For convenience of description, FIGS. 5 and 6 may illustrate only a first quadrant of an orthogonal coordinate system. A horizontal axis may represent the operating period T of the first and second thyristors 10 and 20, and a vertical axis may represent the first and second measurement values with respect to the currents I flowing through the first and second thyristors 10 and 20.

FIG. 5A may be a view illustrating the current I flowing through the first thyristor 10 according to the period T when the power supply unit 100 supplies AC power to the first and second thyristors 10 and 20. In this case, the first thyristor 10 may output a certain current value $I_a$ in odd periods T1, T3, etc.

The certain current value $I_a$ may be, for example, 10 A, and fault current values $I_b$ and $I_c$ may be, for example, 20 A.

The certain current value $I_a$ may be in the first range, and the fault current values $I_b$ and $I_c$ may be in the second range exceeding the first range.

FIG. 5B may be a view illustrating the current I flowing through the second thyristor 20 according to the period T when the power supply unit 100 supplies AC power to the first and second thyristors 10 and 20. In this case, the second thyristor 20 may output a certain current value $I_a$ in even periods T2, T4, etc.

FIG. 5C may be a view illustrating the currents I flowing through the first and second thyristors 10 and 20 according to the period T when the power supply unit 100 supplies AC power to the first and second thyristors 10 and 20. In this case, the first and second thyristors 10 and 20 may output a certain current value $I_a$ in all periods T1, T2, T3, T4, etc.

That is, the comparator 60 receives the certain current value $I_a$ and does not output any discrete signal, and the detection logic 70 may determine the first and second thyristors 10 and 20 as normally operating, based on the situation that any discrete signal is not inputted from the comparator 60.

FIG. 6A may illustrate the fault of the first thyristor 10. FIG. 6A may be a view illustrating the current I flowing through the first thyristor 10 according to the period T when the power supply unit 100 supplies AC power to the first and second thyristors 10 and 20. In this case, since the first thyristor 10 is defective, the internal resistance of the first thyristor 10 is close to 0 Ω. Thus, the fault current values $I_b$ and $I_c$ may be outputted in all periods T1, T2, T3, T4, etc. of the first thyristor 10.

FIG. 6B may be a view illustrating the current I flowing through the second thyristor 20 according to the period T when the power supply unit 100 supplies AC power to the first and second thyristors 10 and 20. In this case, when the second thyristor 20 is normal, the second thyristor 20 may output a certain current value $I_a$ in even periods T2, T4, etc.

FIG. 6C may be a view illustrating the currents I flowing through the first and second thyristors 10 and 20 according to the period T when the power supply unit 100 supplies AC power to the first and second thyristors 10 and 20. When the first thyristor 10 is defective and the second thyristor 20 is normal, the first and second thyristors 10 and 20 may output a normal current value of 10 A in odd periods T1, T3, etc., but may output the fault current values $I_b$ and $I_c$ of 20 A in even periods T2, T4, etc.

That is, the comparator 60 may receive the certain current value $I_a$ and the fault current values $I_b$ and $I_c$ and may not output any discrete signal with respect to the certain current value $I_a$ and output the discrete signal having logic 0 (low) with respect to the fault current values $I_b$ and $I_c$. The detection logic 70 may determine the first thyristor 10 as normal, based on the situation that any discrete signal is not outputted from the comparator 60, and may determine the second thyristor 20 as defective, based on the situation that the discrete signal having logic 0 (low) is outputted from the comparator 60.

The defective thyristor of the anti-parallel thyristors 10 and 20 becomes a short state and thus may be a circuit having an internal resistance close to 0 Ω.

Since the defective thyristor is in the short state, the current may always flow without regard to the switching operations of the anti-parallel thyristors 10 and 20. Since the internal resistance of the defective thyristor is 0 Ω, a larger current than a normal current may flow.

The comparator 60 detects the current measured in the normal thyristor and the current measured in the defective thyristor at the same time. A larger current than a current when the thyristor of the anti-parallel thyristors 10 and 20 is defective may be received, and the discrete signal having logic 1 (high) or logic 0 (low) may be generated as the output value.

FIGS. 7 and 8 are views illustrating currents flowing through the first and second thyristors 10 and 20, a current inputted to the comparator 60, a current outputted from the comparator 60, and signals outputted from the first and second output units 80 and 90 in the fault detector for the anti-parallel thyristor according to an embodiment of the present invention.

For convenience of description, FIGS. 7 and 8 may illustrate only a first quadrant of an orthogonal coordinate system. A horizontal axis may be a time (t) axis and a vertical axis may be a current (I) value.

Figure 7A:
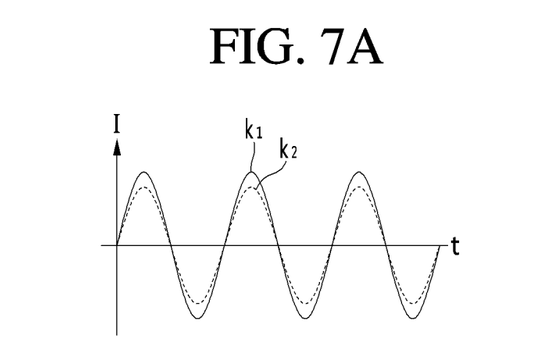
FIGS. 7A, 7B, 7C, 7D, 7E, 7F are views illustrating waveforms obtained when currents detected by current sensors of the fault detector for the anti-parallel thyristor are compared by a comparator and a fault notification signal is outputted when it is determined from the comparison result that one of anti-parallel thyristors is defective.

FIG. 7A is a view illustrating the currents I flowing through the first and second thyristors 10 and 20 according to the time t, wherein the currents I are measured by the first and second current sensors 40 and 50.

A solid line k1 of FIG. 7A may indicate the current flowing through the first thyristor 10, which is measured by the first current sensor 40, and a dashed line k2 of FIG. 7A may indicate the current flowing through the second thyristor 20, which is measured by the second current sensor 50.

A difference between the magnitude of the current flowing through the first thyristor 10 and the magnitude of the current flowing through the second thyristor 20 can be known from FIG. 7A.

Figure 7B:
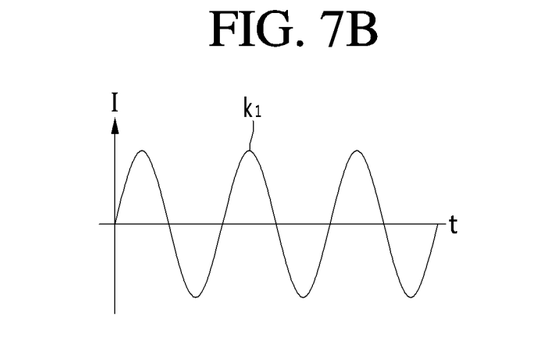
Figure 7C:
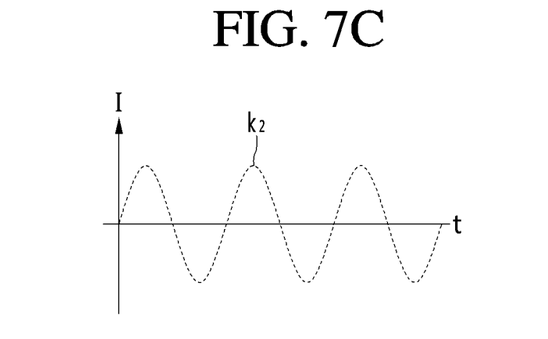

A solid line k1 of FIG. 7B indicates a waveform of the current I flowing through the first thyristor 10, which is inputted to the comparator 60, according to the time t, and a dashed line k2 of FIG. 7C indicates a waveform of the current I flowing through the second thyristor 20, which is inputted to the comparator 60, according to the time t.

That is, FIG. 7B may be a view illustrating the input of the current of the first thyristor 10 to the first input terminal of the comparator 60 through the first current sensor 40, and FIG. 7C may be a view illustrating the input of the current of the second thyristor to the second input terminal of the comparator 60 through the second current sensor 50.

It can be seen from FIGS. 7A to 7C that the magnitude of the current flowing through the first thyristor 10 is different from the magnitude of the current flowing through the second thyristor 20.

For example, when the first and second current sensors 40 and 50 are Rogowski coil current sensors, the first and second current sensors 40 and 50 may measure the currents through a change in magnetic flux generated by a change in the first and second thyristors 10 and 20. The first and second current sensors and 50 may output the current measurement values to the comparator 60, and the comparator 60 may compare the magnitudes of the currents.

According to embodiments, the current is measured and the current is outputted, but the current sensor may be a sensor which measures a current and outputs a voltage.

Figure 7D:
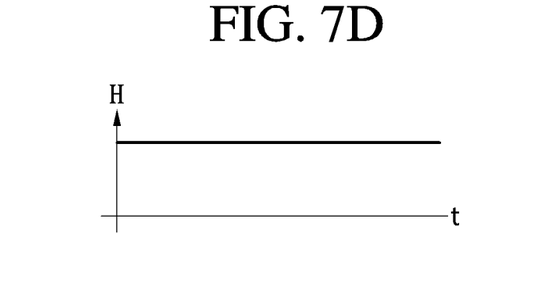

FIG. 7D illustrates a discrete signal outputted by the comparator 60. In FIG. 7D, a vertical axis H may be a high signal or a low signal of the discrete signal, and a horizontal axis may represent the passage of time t. That is, FIG. 7D may show the output of the high signal.

Figure 7E:
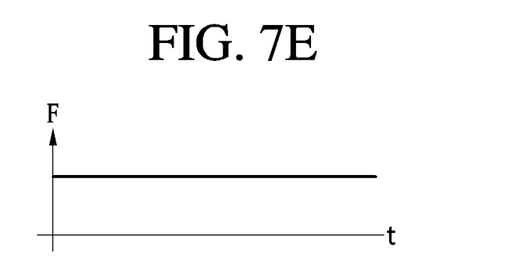

FIG. 7E illustrates the fault notification signal outputted by the first output unit 80.

Figure 7F:
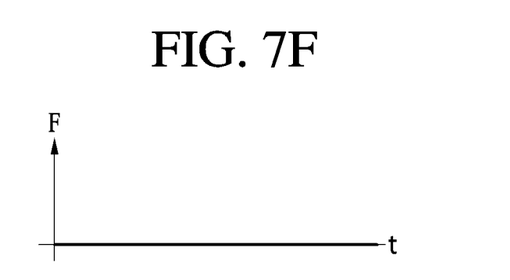

FIG. 7F illustrates a state in which the second output unit 90 does not output a signal.

In FIGS. 7E and 7F, a vertical axis F may represent a fault, and a horizontal axis t may represent the passage of time.

That is, the comparator 60 may compare the current flowing through the first thyristor 10 with the current flowing through the second thyristor 20, detect that the current of the first thyristor 10 is larger, based on the comparison, and output the discrete signal.

The detection logic 70 may determine the first thyristor 10 as defective, and the first output unit 80 may output the fault notification signal.

Figure 8A:
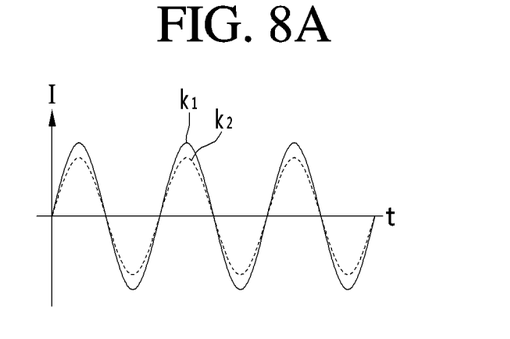
FIGS. 8A, 8B, 8C, 8D, 8E, 8F are views illustrating waveforms obtained when currents detected by current sensors of the fault detector for the anti-parallel thyristor are compared by the comparator and a fault notification signal is outputted when it is determined from the comparison result that the other of the anti-parallel thyristors is defective.

FIG. 8A is a view illustrating the currents I flowing through the first and second thyristors 10 and 20 according to the time t, wherein the currents I are measured by the first and second current sensors 40 and 50.

In FIG. 8A, a solid line k1 may indicate the current flowing through the second thyristor 20, and a dashed line k2 may indicate the current flowing through the first thyristor 10.

Figure 8B:
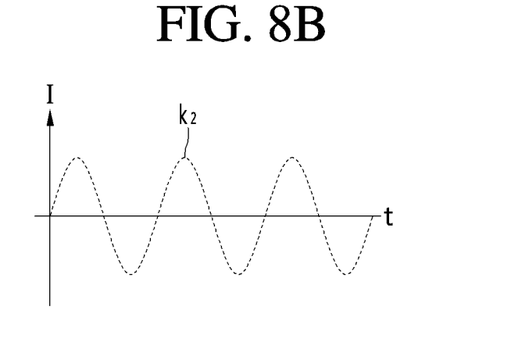
Figure 8C:
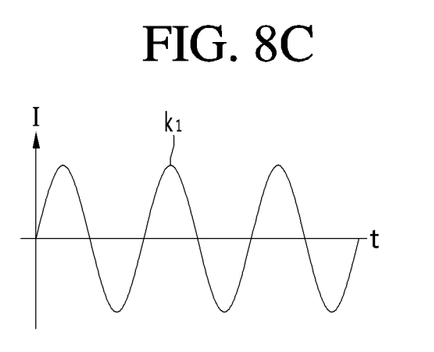

A dashed line k2 of FIG. 8B indicates a waveform of the current I flowing through the first thyristor 10, which is inputted to the first input terminal of the comparator 60, and a solid line k1 of FIG. 8C indicates a waveform of the current I flowing through the second thyristor 20, which is inputted to the second input terminal of the comparator 60.

Figure 8D:
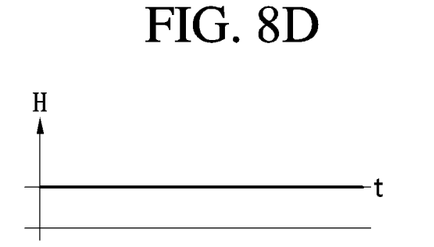

FIG. 8D illustrates a discrete signal outputted by the comparator 60. In FIG. 8D, a vertical axis H may be a high signal or a low signal of the discrete signal, and a horizontal axis may represent the passage of time t. That is, FIG. 8D may show the output of the high signal.

Figure 8E:
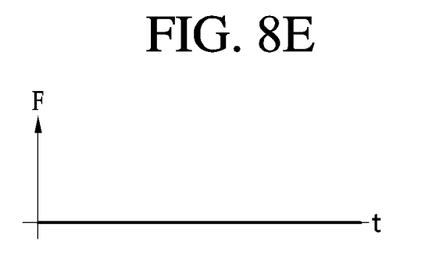

FIG. 8E illustrates a state in which the first output unit 80 does not output a signal.

Figure 8F:
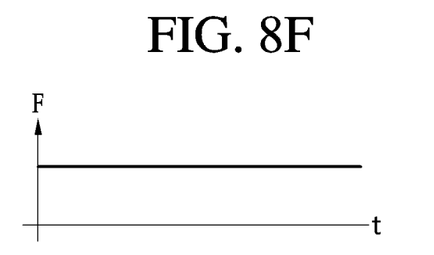

FIG. 8F illustrates the fault notification signal outputted by the second output unit 90.

In FIGS. 8E and 8F, a vertical axis F may represent a fault, and a horizontal axis t may represent the passage of time.

That is, the comparator 60 may compare the current flowing through the first thyristor 10 with the current flowing through the second thyristor 20, detect that the current of the second thyristor 20 is larger, based on the comparison, and output the discrete signal.

The detection logic 70 may determine the second thyristor 20 as defective, and the second output unit 90 may output the fault notification signal.

The fault detector for the anti-parallel thyristor according to the embodiment of the present invention may measure the currents of the anti-parallel thyristors through the current sensors and compare the measurement values, thereby easily determining the fault of the anti-parallel thyristor.

Additionally, the first current sensor and the second current sensor may be Rogowski coil current sensors and may detect the current of the anti-parallel thyristor in a state of being in non-contact with the anti-parallel thyristor, thereby facilitating the fault detection of the anti-parallel thyristor.

Furthermore, the fault detector for the anti-parallel thyristor may receive the fault notification signal based on the measurement values from the first and second output units and easily detect the defective anti-parallel thyristor.

Moreover, the comparator may accurately detect the defective thyristor from the anti-parallel thyristors through the comparison of the first and second measurement values respectively measured by the first and second current sensors.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A fault detector for an anti-parallel thyristor, which detects fault of first and second thyristors connected in anti-parallel to each other, the fault detector comprising:
   a power supply unit configured to supply power to the first and second thyristors;
   a first current sensor configured to output a first current measurement value that flows through the first thyristor;
   a second current sensor configured to output a second current measurement value that flows through the second thyristor;
   a comparator including a first input terminal connected to the first current sensor and a second input terminal connected to the second current sensor, wherein the comparator does not output a discrete signal when the first or second current measurement value is in a normal range, and outputs the discrete signal when the first or second current measurement value is in a fault range;
   a detection logic connected to an output terminal of the comparator; and
   first and second output units connected to the detection logic.

2. The fault detector of claim 1, wherein the comparator sets the normal range for determination as normal and the fault range for determination as defective.

3. The fault detector of claim 2, wherein the fault range is greater than the normal range.

4. The fault detector of claim 1, wherein the discrete signal comprises first and second signals having different levels with respect to the first and second thyristors.

5. The fault detector of claim 4, wherein the detection logic generates a fault signal based on the first signal and transmits the fault signal to the first output unit.

6. The fault detector of claim 5, wherein the detection logic generates a fault signal based on the second signal and transmits the fault signal to the second output unit.

7. The fault detector of claim 6, wherein the first output unit or the second output unit outputs a fault notification signal corresponding to the fault signal.

8. The fault detector of claim 1, wherein each of the first and second current sensors is a Rogowski coil current sensor.

9. The fault detector of claim 1, wherein the first current sensor measures a current flowing through the first thyristor in a state of being in non-contact with the first thyristor, and
   the second current sensor measures a current flowing through the second thyristor in a state of being in non-contact with the second thyristor.

10. The fault detector of claim 1, wherein the power supply unit receives power from the outside and supplies the power to the inside of the detector and the first and second thyristors.

11. The fault detector of claim 1, wherein the first and second thyristors connected in anti-parallel to each other further comprise an RC snubber circuit, and
    the RC snubber circuit comprises a resistor and a capacitor connected in series to each other.

* * * * *